United States Patent
Choi et al.

(10) Patent No.: US 9,218,975 B2
(45) Date of Patent: Dec. 22, 2015

(54) METHODS OF FORMING A REPLACEMENT GATE STRUCTURE HAVING A GATE ELECTRODE COMPRISED OF A DEPOSITED INTERMETALLIC COMPOUND MATERIAL

(75) Inventors: Kisik Choi, Hopewell Junction, NY (US); Mark V. Raymond, Schenectady, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 194 days.

(21) Appl. No.: 13/588,517

(22) Filed: Aug. 17, 2012

(65) Prior Publication Data

US 2014/0051240 A1  Feb. 20, 2014

(51) Int. Cl.
| | |
|---|---|
| *H01L 21/28* | (2006.01) |
| *H01L 21/8238* | (2006.01) |
| *H01L 29/49* | (2006.01) |
| *H01L 29/66* | (2006.01) |
| *H01L 29/78* | (2006.01) |

(52) U.S. Cl.
CPC .... *H01L 21/28088* (2013.01); *H01L 21/28097* (2013.01); *H01L 21/823842* (2013.01); *H01L 29/4966* (2013.01); *H01L 29/4975* (2013.01); *H01L 29/66545* (2013.01); *H01L 29/6659* (2013.01); *H01L 29/785* (2013.01); *H01L 29/7833* (2013.01)

(58) Field of Classification Search
CPC ............... H01L 21/28088; H01L 21/28097; H01L 21/823842; H01L 29/66545; H01L 29/4966; H01L 29/6659; H01L 29/785

USPC .................................................. 438/592, 595
See application file for complete search history.

(56) References Cited

U.S. PATENT DOCUMENTS

| | | | |
|---|---|---|---|
| 8,222,132 B2 | 7/2012 | Lee et al. | |
| 2005/0136677 A1* | 6/2005 | Brask et al. | 438/706 |
| 2008/0197426 A1* | 8/2008 | Okazaki | 257/411 |
| 2008/0283906 A1* | 11/2008 | Bohr | 257/327 |
| 2011/0097884 A1* | 4/2011 | Visokay et al. | 438/586 |
| 2011/0156107 A1* | 6/2011 | Bohr et al. | 257/288 |
| 2012/0043623 A1* | 2/2012 | Doris et al. | 257/410 |
| 2013/0037889 A1* | 2/2013 | Liao et al. | 257/411 |
| 2013/0168744 A1* | 7/2013 | Hsu et al. | 257/288 |

FOREIGN PATENT DOCUMENTS

CN  101752317 A  6/2010

OTHER PUBLICATIONS

Translation of Chinese Office Action Dated Oct. 9, 2015 for CN Application No. 2013103619076, filed on Aug. 19, 2013.

* cited by examiner

*Primary Examiner* — Christine Enad
(74) *Attorney, Agent, or Firm* — Amerson Law Firm, PLLC

(57) ABSTRACT

Disclosed herein are various methods of forming a replacement gate structure with a gate electrode comprised of a deposited intermetallic compound material. In one example, the method includes removing at least a sacrificial gate electrode structure to define a gate cavity, forming a gate insulation layer in the gate cavity, performing a deposition process to deposit an intermetallic compound material in the gate cavity above the gate insulation layer, and performing at least one process operation to remove portions of intermetallic compound material positioned outside of the gate cavity.

18 Claims, 8 Drawing Sheets

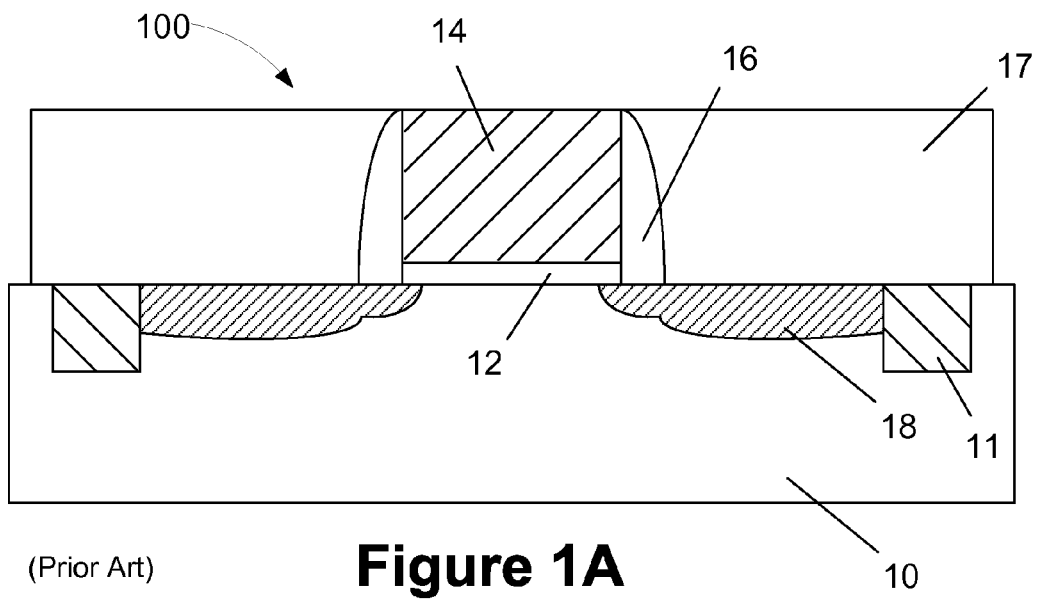
(Prior Art) Figure 1A
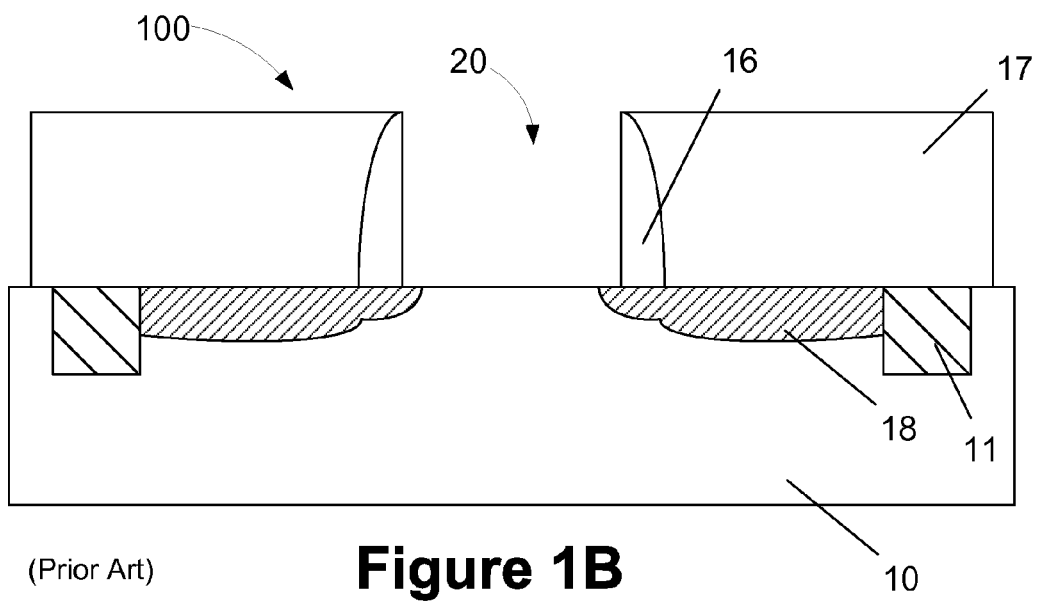
(Prior Art) Figure 1B

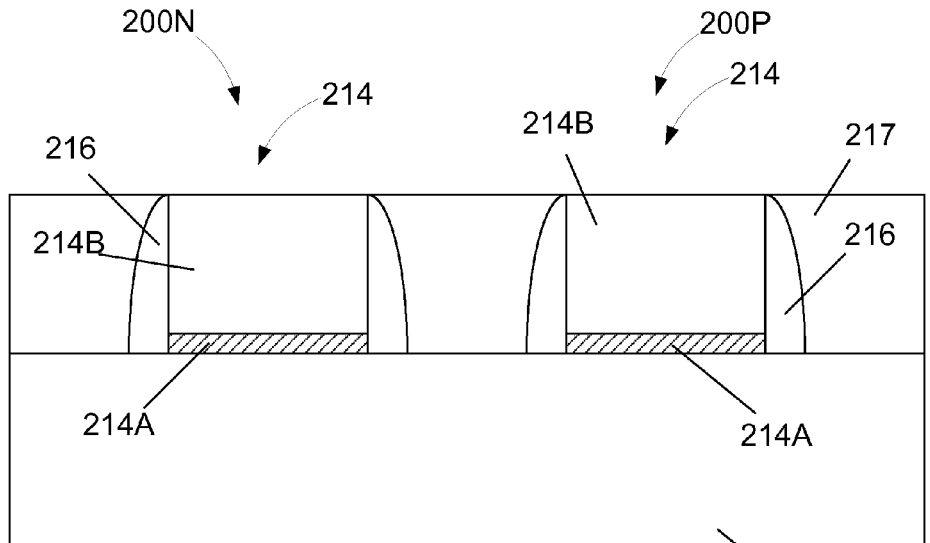
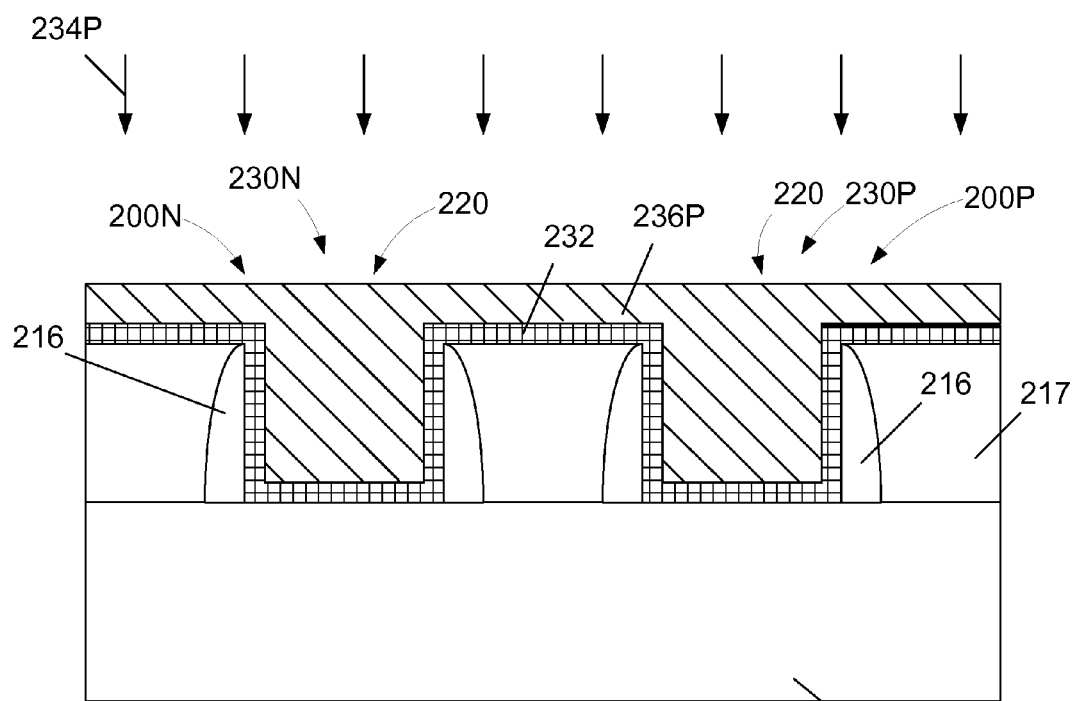

METHODS OF FORMING A REPLACEMENT GATE STRUCTURE HAVING A GATE ELECTRODE COMPRISED OF A DEPOSITED INTERMETALLIC COMPOUND MATERIAL

BACKGROUND OF THE INVENTION

1. Field of the Invention

Generally, the present disclosure relates to the manufacture of sophisticated semiconductor devices, and, more specifically, to various methods of forming replacement gate structures with a gate electrode comprised of a deposited intermetallic compound material.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NMOS and PMOS transistors) represent one important type of circuit element that substantially determines performance of such integrated circuits. During the fabrication of complex integrated circuits using, for instance, MOS technology, millions of transistors, e.g., NMOS transistors and/or PMOS transistors, are formed on a substrate including a crystalline semiconductor layer. A field effect transistor, whether an NMOS or a PMOS device, is a planar device that typically includes a source region, a drain region, a channel region that is positioned between the source region and the drain region, and a gate electrode positioned above the channel region.

In a field effect transistor, the conductivity of the channel region, i.e., the drive current capability of the conductive channel, is controlled by the gate electrode formed above the channel region and separated therefrom by a thin gate insulation layer. The conductivity of the channel region, upon formation of a conductive channel due to the application of an appropriate control voltage to the gate electrode, depends on, among other things, the dopant concentration within the channel, the mobility of the charge carriers and, for a given extension of the channel region in the transistor width direction, the distance between the source and drain regions, which is also referred to as the channel length of the transistor. Hence, in combination with the capability of rapidly creating a conductive channel below the insulating layer upon application of the appropriate control voltage to the gate electrode, the conductivity of the channel region substantially affects the performance of field effect transistors. Thus, since the speed of creating the channel, which depends in part on the conductivity of the gate electrode, and the channel resistivity substantially determine the characteristics of the transistor, the scaling of the channel length, and associated therewith the reduction of channel resistivity and the increase of gate resistivity, are dominant design efforts used to increase the operating speed of the integrated circuits.

For many early device technology generations, the gate electrode structures of most transistor elements has been comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the short channel effects which may be associated with the use of traditional silicon-based materials in reduced channel length transistors. For example, in some aggressively scaled transistor elements, which may have channel lengths on the order of approximately 10-20 nm, gate electrode stacks comprising a so-called high-k dielectric/metal gate (HK/MG) configuration have been shown to provide significantly enhanced operational characteristics over the heretofore more commonly used silicon dioxide/polysilicon (SiO/poly) configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. FIGS. 1A-1D depict one illustrative prior art method for forming an HK/MG replacement gate structure using a gate last technique. As shown in FIG. 1A, the process includes the formation of a basic transistor structure 100 above a semiconducting substrate 10 in an active area defined by a shallow trench isolation structure 11. At the point of fabrication depicted in FIG. 1A, the device 100 includes a sacrificial gate insulation layer 12, a dummy or sacrificial gate electrode 14, sidewall spacers 16, a layer of insulating material 17 and source/drain regions 18 formed in the substrate 10. The various components and structures of the device 100 may be formed using a variety of different materials and by performing a variety of known techniques. For example, the sacrificial gate insulation layer 12 may be comprised of silicon dioxide, the sacrificial gate electrode 14 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 10 using known masking and ion implantation techniques. Of course, those skilled in the art will recognize that there are other features of the transistor 100 that are not depicted in the drawings for purposes of clarity. For example, so-called halo implant regions are not depicted in the drawings as well as various layers or regions of silicon/germanium that are typically found in high performance PMOS transistors. At the point of fabrication depicted in FIG. 1A, the various structures of the device 100 have been formed and a chemical mechanical polishing process (CMP) has been performed to remove any materials above the sacrificial gate electrode 14 (such as a protective cap layer (not shown) comprised of silicon nitride) so that at least the sacrificial gate electrode 14 may be removed.

As shown in FIG. 1B, one or more etching processes are performed to remove the sacrificial gate electrode 14 and the sacrificial gate insulation layer 12 to thereby define a gate cavity 20 where a replacement gate structure will subsequently be formed. A masking layer that is typically used in such etching processes is not depicted for purposes of clarity.

Typically, the sacrificial gate insulation layer 12 is removed as part of the replacement gate technique, as depicted herein. However, the sacrificial gate insulation layer 12 may not be removed in all applications.

Next, as shown in FIG. 1C, various layers of material that will constitute a replacement gate structure 30 are formed in the gate cavity 20. The materials used for such replacement gate structures 30 may vary depending upon the particular application. Even in cases where the sacrificial gate insulation layer 12 is intentionally removed, there will typically be a very thin native oxide layer (not shown) that forms on the substrate 10 within the gate cavity 20. In one illustrative example, the replacement gate structure 30 is comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C (e.g., a layer of tantalum nitride with a thickness of about 1-2 nm) and a third metal layer 30D (e.g., a layer of titanium nitride with a thickness of about 5 nm) and a bulk metal layer 30E, such as aluminum. Ultimately, as shown in FIG. 1D, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30.

The formation of replacement gate structures is a complex process that requires highly accurate and repeatable manufacturing processes. As the gate length of transistor devices has decreased to extremely small dimensions, e.g., 10-20 nm or less, the process of forming replacement gate structures becomes even more difficult. That is, given the physical size of the gate cavity 20, and the thickness of the various layers of material that are formed to make the replacement gate structure 30, it is very difficult to form all of these layers of material in such a small gate cavity 20 and make a reliable, defect-free replacement gate structure 30.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a replacement gate structure with a gate electrode comprised of at least a deposited intermetallic compound material, such as, for example, a metal silicide or a metal carbide material. In one example, the method includes removing at least a sacrificial gate electrode structure to define a gate cavity, forming a gate insulation layer in the gate cavity, performing a deposition process to deposit an intermetallic compound material in the gate cavity above the gate insulation layer and performing at least one process operation to remove portions of the intermetallic compound material positioned outside of the gate cavity.

In another illustrative example, the method is directed to forming replacement gate structures for first and second transistors that are of the opposite type, i.e., the first one is a PMOS device and the second one is an NMOS device (or vice versa). In one example, this embodiment involves forming first and second sacrificial gate structures above a semiconducting substrate, wherein each of the first and second sacrificial gate structures comprises at least a sacrificial gate electrode, performing at least one first etching process to remove at least the sacrificial gate electrode structure from each of the first and second sacrificial gate structures so as to thereby define a first gate cavity and a second gate cavity, and forming a gate insulation layer in the first and second gate cavities. This embodiment also includes the steps of performing a first deposition process to deposit a first intermetallic compound material in the first and second gate cavities above the gate insulation layer, performing at least one second etching process to remove portions of the first intermetallic compound material that is positioned in the second gate cavity, performing a second deposition process to deposit a second intermetallic compound material in the second gate cavity and above the first intermetallic compound material, wherein the first intermetallic compound material and the second intermetallic compound material are different materials, and performing at least one process operation to remove portions of the first and second intermetallic compound materials that are positioned outside of the first and second gate cavities.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative prior art process flow for forming a semiconductor device using a so-called "gate last" or "replacement gate" approach;

FIGS. 3A-3E depict another illustrative method and device disclosed herein wherein the presently disclosed inventions may be employed in a CMOS application.

Figure 1C:
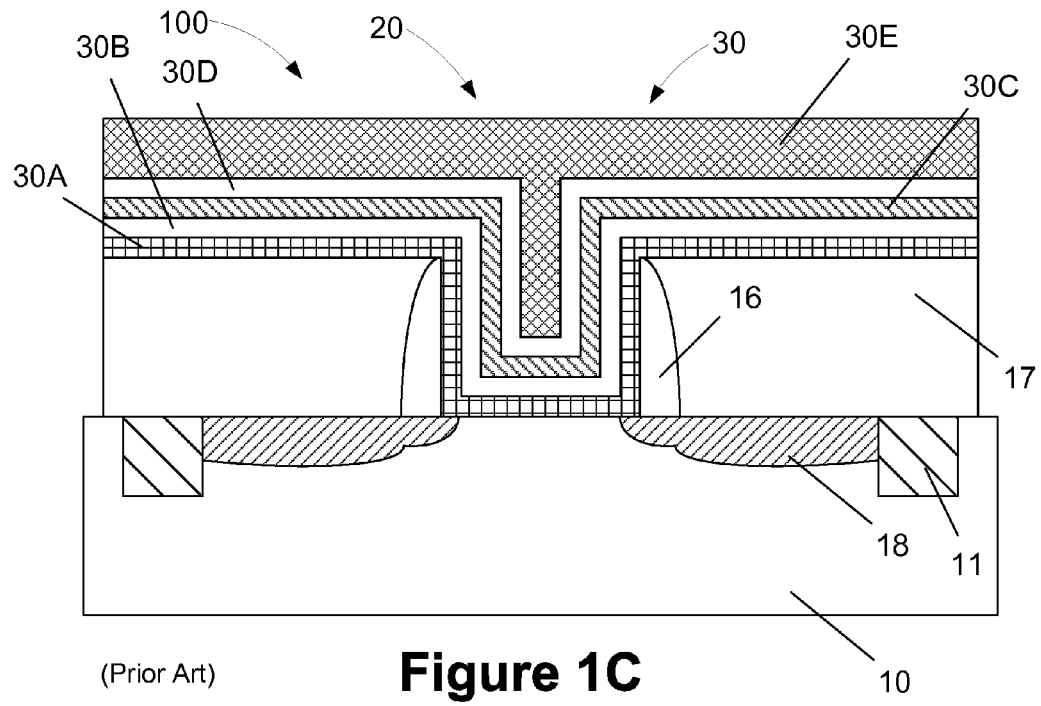
Figure 1D:
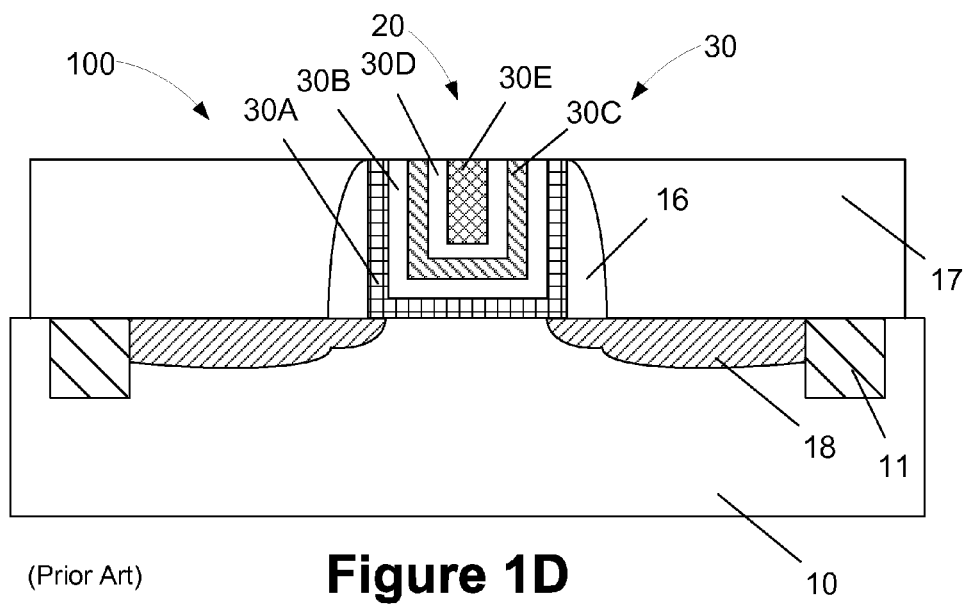

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a replacement gate structure with a gate electrode comprised of at least a deposited intermetallic compound material. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. With reference to the attached drawings, various illustrative embodiments of the methods and devices disclosed herein will now be described in more detail.

Figure 2A:
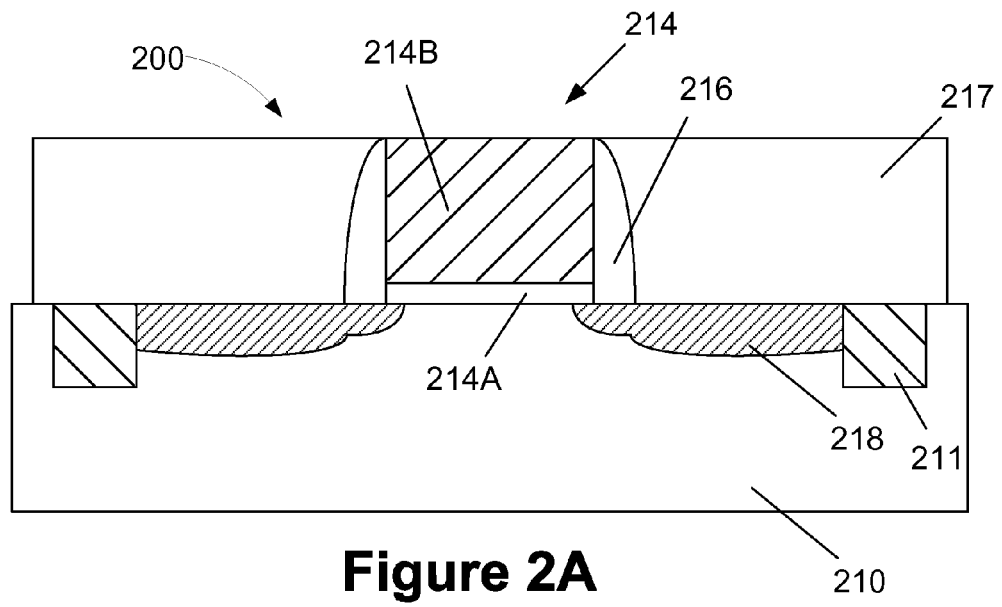
FIGS. 2A-2F depict one illustrative method and device disclosed herein wherein the device includes a replacement gate electrode comprised of a deposited intermetallic compound material.

FIG. 2A is a simplified view of an illustrative semiconductor device 200 at an early stage of manufacturing that is formed above a semiconducting substrate 210. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. Thus, the terms "substrate" or "semiconducting substrate" should be understood to cover all forms of semiconductor structures. The substrate 210 may also be made of materials other than silicon.

At the point of fabrication depicted in FIG. 2A, the device 200 includes a sacrificial gate structure 214 and sidewall spacers 216 positioned in a layer of insulating material 217 formed above the substrate 210 and illustrative source/drain regions 218 that have been formed in the substrate 210. In the depicted example, the sacrificial gate structure 214 includes a sacrificial gate insulation layer 214A and a sacrificial gate electrode 214B. In general, in FIG. 2A, the device 200 is depicted at the point of fabrication that corresponds to that depicted in FIG. 1A for the device 100. Thus, the discussion about illustrative materials and methods of manufacture employed in making the device 100 apply equally to the device 200 up to this point of fabrication.

The various components and structures of the device 200 may be formed using a variety of different materials and by performing a variety of known techniques. For example, the sacrificial gate insulation layer 214A may be comprised of silicon dioxide, the sacrificial gate electrode 214B may be comprised of polysilicon or amorphous silicon, the sidewall spacers 216 may be comprised of silicon nitride and the layer of insulating material 217 may be comprised of silicon dioxide. The sacrificial gate electrode 214B and the sacrificial gate insulation layer 214A may be of any desired thickness or configuration. In one example, the sacrificial gate electrode 214B may have a critical dimension of 20 nm or less. The illustrative source/drain regions 218 are comprised of implanted dopant materials (N-type dopants for NMOS devices and P-type dopants for PMOS devices) that are implanted into the substrate 210 using known masking and ion implantation techniques not depicted. Of course, those skilled in the art will recognize that there are other features of the transistor 200 that are not depicted in the drawings so as not to obscure the present invention. For example, so-called halo implant regions and various layers or regions of silicon/germanium that are typically found in high performance PMOS transistors are not depicted in the drawings. Lastly, the device 200 may be provided with raised or planar source/drain regions. For simplification, the device 200 will be depicted as if planar source/drain regions are formed in the substrate 210. At the point of fabrication depicted in FIG. 2A, the various structures of the device 200 have been formed and a chemical mechanical polishing process (CMP) has been performed to remove any materials above the sacrificial gate electrode 214B (such as a protective cap layer (not shown) comprised of silicon nitride) so that at least the sacrificial gate electrode 214B may be removed.

Figure 2B:
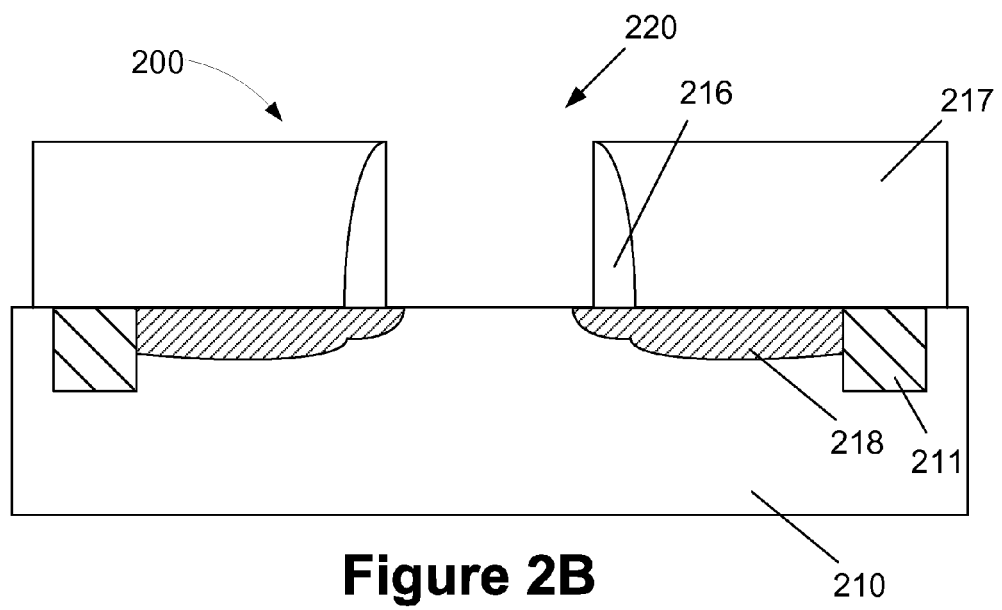

As shown in FIG. 2B, one or more etching processes are performed to remove the sacrificial gate electrode 214B and the sacrificial gate insulation layer 214A to thereby define a gate cavity 220 where a replacement gate structure will subsequently be formed, as described more fully below. By stating that the gate cavity 220 is formed in a layer of insulating material, it is intended to cover situations where the gate cavity is formed in any combination of insulating materials that may exist at the level for the gate cavity 220, whatever form such insulating materials may take. For example, such language should be understood to cover situations where the gate opening 220 is formed between the depicted sidewall spacers 216 and the depicted single layer of insulating material 217. Such language should also be understood to cover situations where a sidewall spacer might not be present and/or where the layer of insulating material 217 may be comprised of a plurality of layers of insulating material. A masking layer that is typically used in such etching processes is not depicted for purposes of clarity. Typically, the sacrificial gate insulation layer 214A is removed as part of the replacement gate technique, as depicted herein. However, the sacrificial gate insulation layer 214A may not be removed in all applications. Even in cases where the sacrificial gate insulation layer 214A is intentionally removed, there will typically be a very thin native oxide layer (not shown) that forms on the substrate 210 within the gate cavity 220.

In general, the present disclosure is directed to forming a novel replacement gate structure 230 in the gate cavity 220 and novel methods of forming such a gate structure 230. As described more fully below, according to the present invention, the gate electrode of the replacement gate structure 230 will be comprised of a deposited intermetallic compound material, such as, for example, a deposited metal silicide material or a deposited metal carbide material that is formed during the material deposition process. The intermetallic compound material may be formed by performing a chemical vapor deposition (CVD) process, an atomic layer deposition (ALD) process, or a physical vapor deposition (PVD) process, etc. The intermetallic compound material may be comprised of a variety of different metal compositions, the selection of which may depend upon the particular application. For example, in the case where the intermetallic compound material is a deposited metal silicide material, it may be comprised of one of the following: tungsten silicide ($WSi_x$), nickel silicide ($NiSi_x$), platinum silicide (PtSi), erbium silicide (ErSi), hafnium silicide (HfSi), ytterbium silicide (YbSi), cobalt silicide (CoSi), $MoSi_x$, $TaSi_x$, an alloy combination of the above, for example an NiEr-silicide intermetallic alloy, etc. In the case where the intermetallic compound material is a deposited metal carbide material, it may be comprised of one of the following: hafnium carbide (HfC), titanium carbide (TiC), tantalum carbide (TaC), or an alloy combination of any of the above. The gate electrode of the replacement gate structure 230 may also comprise additional metal layers if desired. For example, if the resistivity of the intermetallic compound material is too high, then a pure metal layer, such as tungsten, aluminum, cobalt, etc., may be deposited above the intermetallic compound material.

Figure 2C:
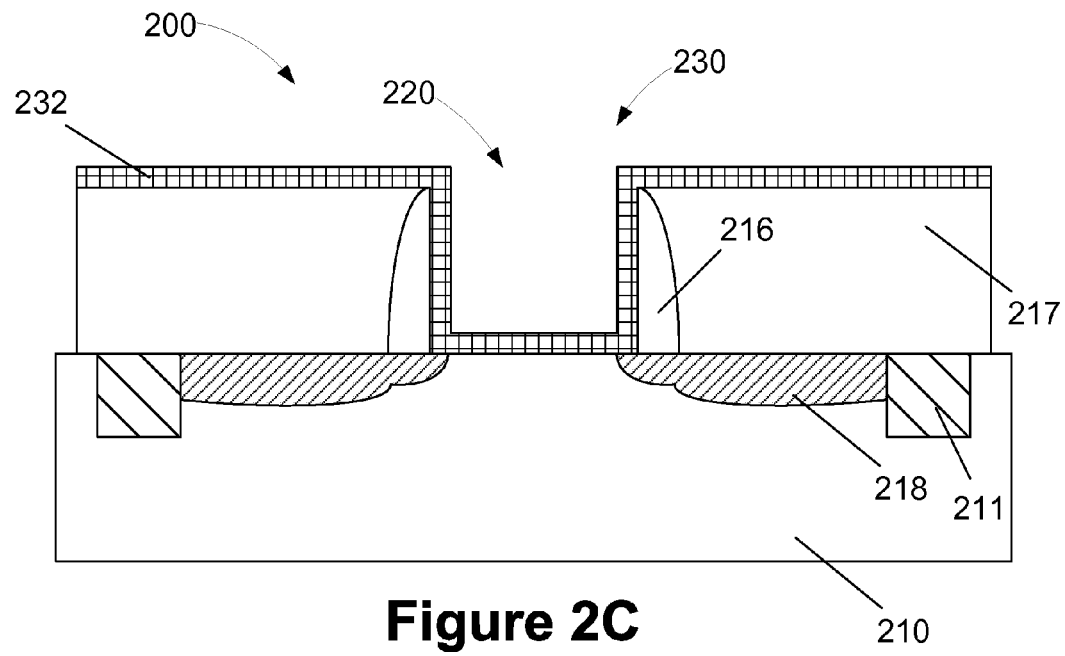

As shown in FIG. 2C, in one illustrative example, the process begins with performing a conformal deposition process to form a high-k (k value greater than 10) gate insulation layer 232 in the gate cavity 220. As noted above, in some cases, if desired, a metal layer (not shown), such as a very thin work function adjusting metal (e.g., a layer of titanium nitride), may be formed on the high-k gate insulation layer 232. As will be recognized by those skilled in the art after a complete reading of the present application, the insulating materials and the metal layer(s) that are part of the replacement gate structure 230 may be of any desired construction and comprised of any of a variety of different materials. Additionally, the replacement gate structure 230 for an NMOS device may have different material combinations as compared to a replacement gate structure 230 for a PMOS device. Thus, the particular details of construction of replacement gate structure 230, and the manner in which such replacement gate electrode structure 230 is formed, should not be considered a limitation of the present invention unless such limitations are expressly recited in the attached claims. The methods disclosed herein may also be employed for replacement gate structures 230 that do not employ a high-k gate insulation layer; although a high-k gate insulation layer will likely be used in most applications.

Figure 2D:
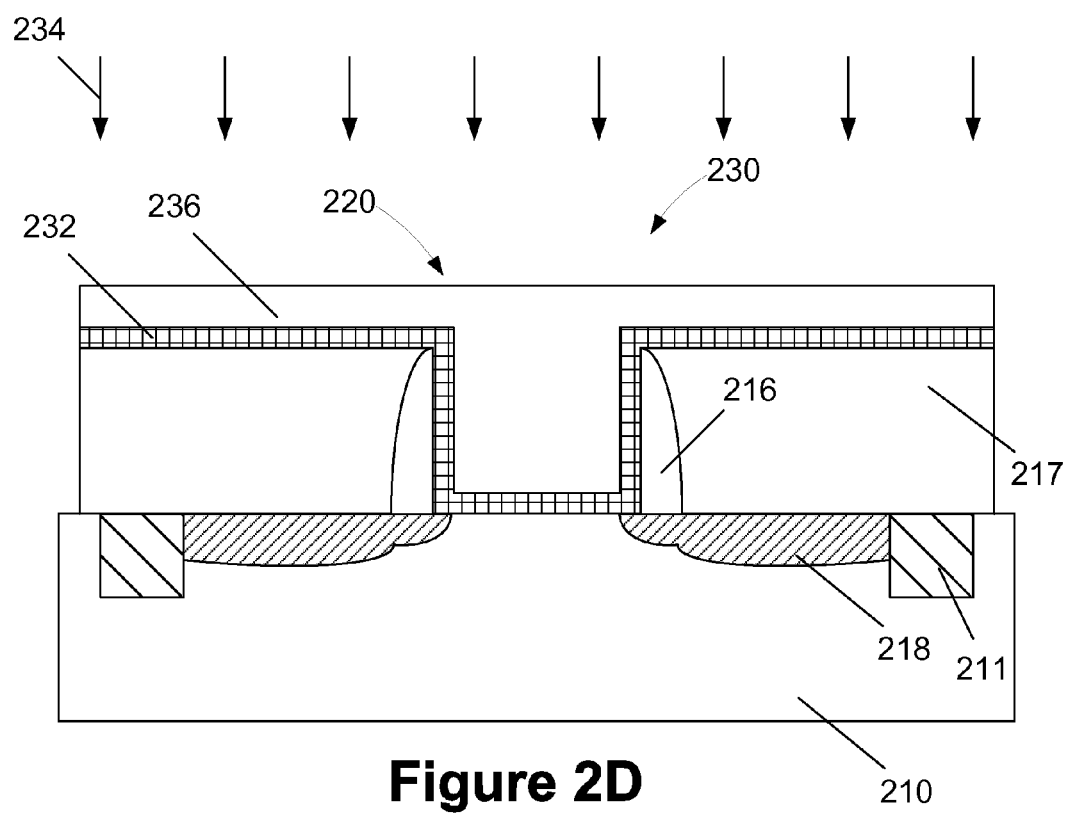

As shown in FIG. 2D, after the gate insulation layer 232 is formed, a deposition process 234 is performed to deposit an intermetallic compound material 236 above the gate insulation layer 232. Importantly, the intermetallic compound material 236 is formed directly as a result of the deposition process 234. For example, in the case where the intermetallic compound material 236 is either a metal silicide material or a metal carbide material, the metal silicide material or the metal carbide material is formed directly as a result of the deposition process. This is in contrast to prior art techniques of forming metal silicide materials that typically involved the formation of a refractory metal layer, such as nickel, on a silicon-containing surface, performing a heating process on the layer of refractory metal to cause a reaction between the layer of refractory metal and the silicon-containing material to thereby form a metal silicide material, performing an etching process to remove unreacted portions of the layer of refractory metal and, in some cases, performing an additional heating process of metal silicide material. By forming the intermetallic compound material 236 directly as a result of the deposition process 234, very small gate cavities 220 may be reliably filled with a conductive material that will serve, at least in part, as the gate electrode for the replacement gate structure 230.

The deposition process 234 and possible intermetallic compound material 236 compositions, such as illustrative metal silicide compositions, have been described previously. As depicted, the intermetallic compound material 236 overfills the unfilled portions of the gate cavity 220. The deposition process 234 may be performed at a variety of temperatures and pressures using appropriate precursor gases at appropriate flow rates to form the metal silicide material 236. In one embodiment, the deposition process 234 may be a CVD process that is performed at a temperature within the range of about 150-900° C. and a pressure that falls within the range of about 0.1-600 Torr. The flow rate of the various precursor gases may also vary depending upon the particular application and the desired rate of formation of the metal silicide material 236, e.g., precursor flow rates on the order of about 1-1000 sccm may be used. Of course, the exact process parameters to be employed an any specific application will have to be confirmed by testing, as is common in qualifying any process used in manufacturing semiconductor devices. If desired, N-type or P-type dopants may be added to the intermetallic compound material 236 as it is being formed, i.e., the deposition process may include an in situ doping process. The work function and/or the resistivity of the intermetallic compound material 236 may be adjusted by varying process conditions, e.g., 4.0-5.15 eV. The work function and/or the resistivity of the intermetallic compound material 236 may also be adjusted by various heat treatments, e.g., heat treatments in the 300-1100° C. range during deposition and/or post treatments.

Figure 2E:
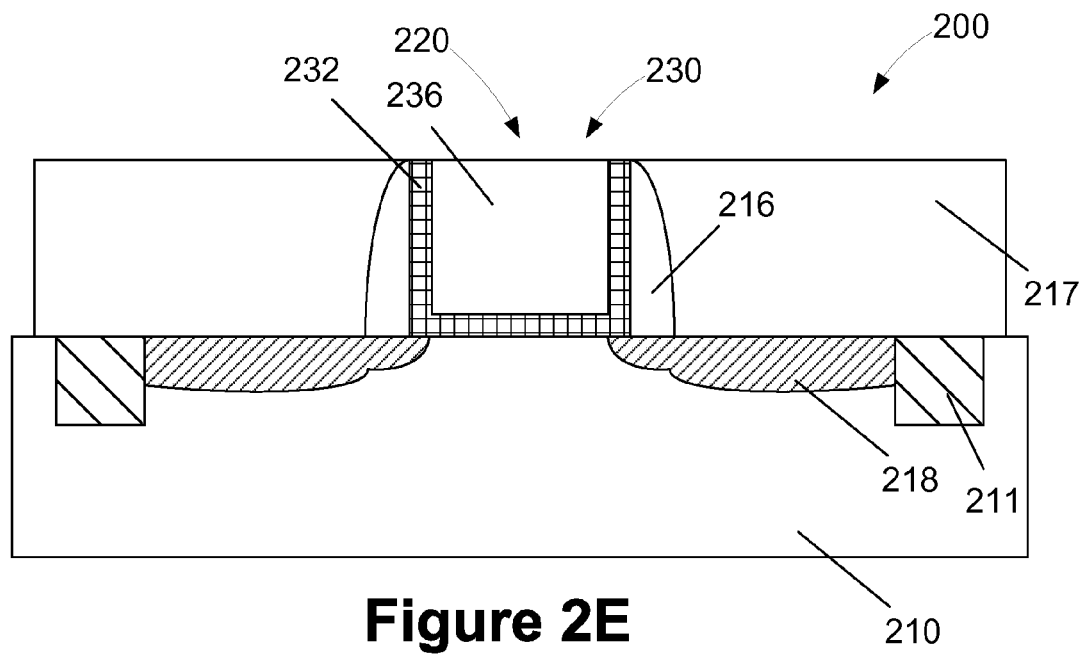
Figure 2F:
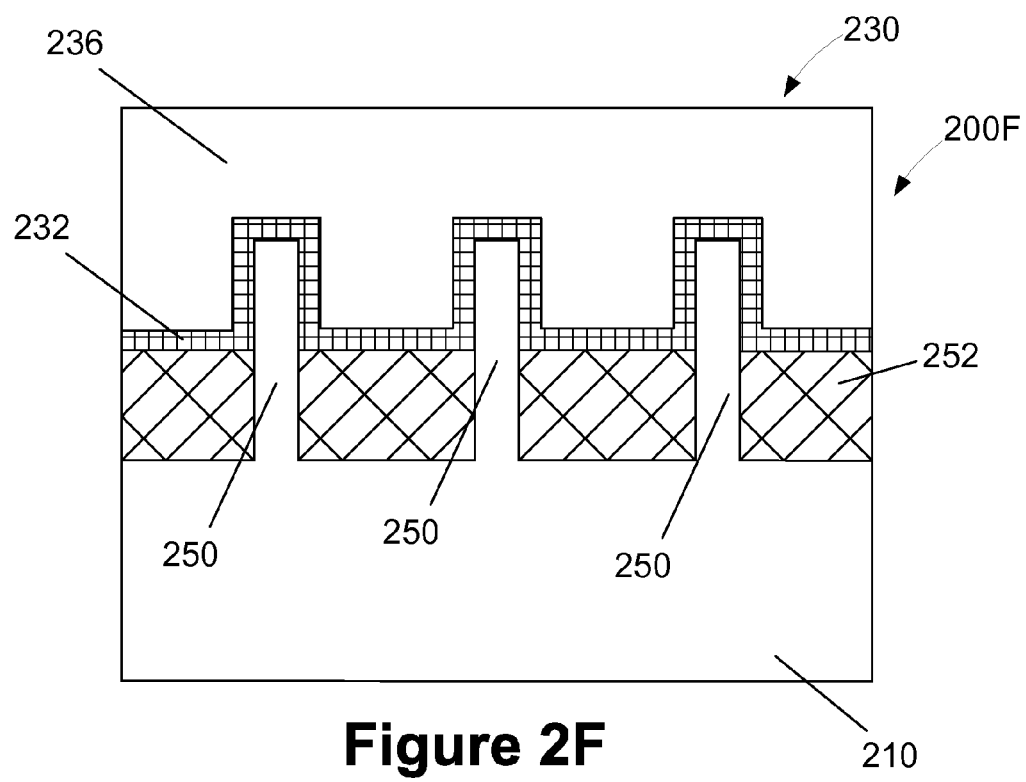

Next, as shown in FIG. 2E, one or more CMP processes are performed to remove excess portions of the insulating layer 232 and the intermetallic compound material 236 that are positioned outside of the gate cavity 220 above the layer of insulating material 217. The removal of the excess material results in the formation of one illustrative embodiment of the novel replacement gate structure 230 disclosed herein. Of course, as will be recognized by those skilled in the art after a complete reading of the present application, the methods of forming replacement gate structures 230 disclosed herein are equally applicable to a variety of semiconductor devices, like the disclosed planar field effect transistor 200 depicted in FIGS. 2A-2E, as well as non-planar devices, such as FinFET device 200F shown in FIG. 2F. FIG. 2F is a cross-sectional view of the illustrative device 200F taken through the gate structure 230 in the gate width direction. The sidewall spacer 216 that would define the gate cavity 220 are not depicted in this view given the location of the cross-section. The device 200F is comprised of a plurality of illustrative fins 250. A local isolation layer 252, e.g., silicon dioxide, is positioned between the fins 250. As depicted therein, the gate insulation layer 232 and the intermetallic compound material 236 are formed around the illustrative fins 250. Thus, the particular type of device wherein the replacement gate structure 230 is employed should not be considered to be a limitation of the presently disclosed inventions.

At the point of fabrication depicted in FIG. 2E, traditional manufacturing operations may be performed to complete the formation of the device 200. For example, contact openings (not shown) may be formed through the layer of insulating material 217 to expose the underlying source/drain regions 218. Thereafter metal silicide regions (not shown) may be formed on the exposed portions of the source/drain regions 218 and conductive contacts (not shown) may be formed in the contact openings to provide electrical connection to the source/drain regions 218. Various metallization layers may then be formed above the device 200 using known processing techniques.

FIGS. 3A-3E depict an illustrative process flow that may be employed to form integrated circuit products using CMOS technology that involves formation of both NMOS and PMOS devices on the same substrate. In FIGS. 3A-3E, various isolation regions that would electrically isolate the NMOS and PMOS devices, as well as the source/drain regions, from such devices are not shown so as not to obscure the present inventions.

As shown in FIG. 3A, an illustrative NMOS device 200N and an illustrative PMOS device 200P will be formed above the substrate 210. At the point of fabrication depicted in FIG. 3A, each of the devices 200N, 200P include a sacrificial gate structure 214 and sidewall spacers 216 positioned in a layer of insulating material 217 formed above the substrate 210. At the point of fabrication depicted in FIG. 3A, the various structures of the devices 200 have been formed and a chemical mechanical polishing process (CMP) has been performed to remove any materials above the sacrificial gate electrodes 214B (such as protective cap layers (not shown) comprised of silicon nitride) so that at least the sacrificial gate electrodes 214B of each of the sacrificial gate structures 214 may be removed.

FIG. 3B depicts the devices 200N, 200P after several process operations have been performed. First, one or more etching processes were performed to remove the sacrificial gate electrode 214B and the sacrificial gate insulation layer 214A from both of the sacrificial gate structures 214 to thereby define a plurality of gate cavities 220 where replacement gate structures 230N, 230P will subsequently be formed for the devices 200N, 200P, respectively, as described more fully below. Thereafter, in one illustrative example, a conformal deposition process was performed to form the high-k (k value greater than 10) gate insulation layer 232 in the gate cavities 220. As noted above, in some cases, if desired, a metal layer (not shown), such as a very thin work function adjusting metal (e.g., a layer of titanium nitride), may be formed on the high-k gate insulation layer 232. Additionally, as noted previously, the replacement gate structure 230N for the NMOS device 200N may have different material combinations as compared to the replacement gate structure 230P for the PMOS device 200P.

With continuing reference to FIG. 3B, the next process operation involves the formation of the intermetallic compound material 236 in the gate cavities 220. However, in a CMOS application, the intermetallic compound material 236 may be tailored for use in the NMOS device 200N as well as in the PMOS device 200P. In the depicted example, a intermetallic compound material 236P, e.g., a metal silicide material, for the PMOS device 200P will be formed first. However, as will be recognized by those skilled in the art after a complete reading of the present application, the process flow may be reversed if desired. That is, the intermetallic compound material 236N for the NMOS device 200N may be formed prior to forming the intermetallic compound material 236P for the PMOS device 200P. As shown in FIG. 3B, after the gate insulation layer 232 is formed, the deposition process 234P is performed to deposit metal silicide material 236P above the gate insulation layer 232. The discussion above regarding the deposition process 234 and the possible compositions of the intermetallic compound material 236 applies to the deposition processes 234P, 234N as well. Importantly, the intermetallic compound material 236P is formed directly as a result of the deposition process 234P. As depicted, the intermetallic compound material 236P overfills the unfilled portions of the gate cavities 220. In one particular example, where the intermetallic compound material 236P is a metal silicide material, it may be a nickel silicide ($NiSi_x$) material.

Figure 3C:
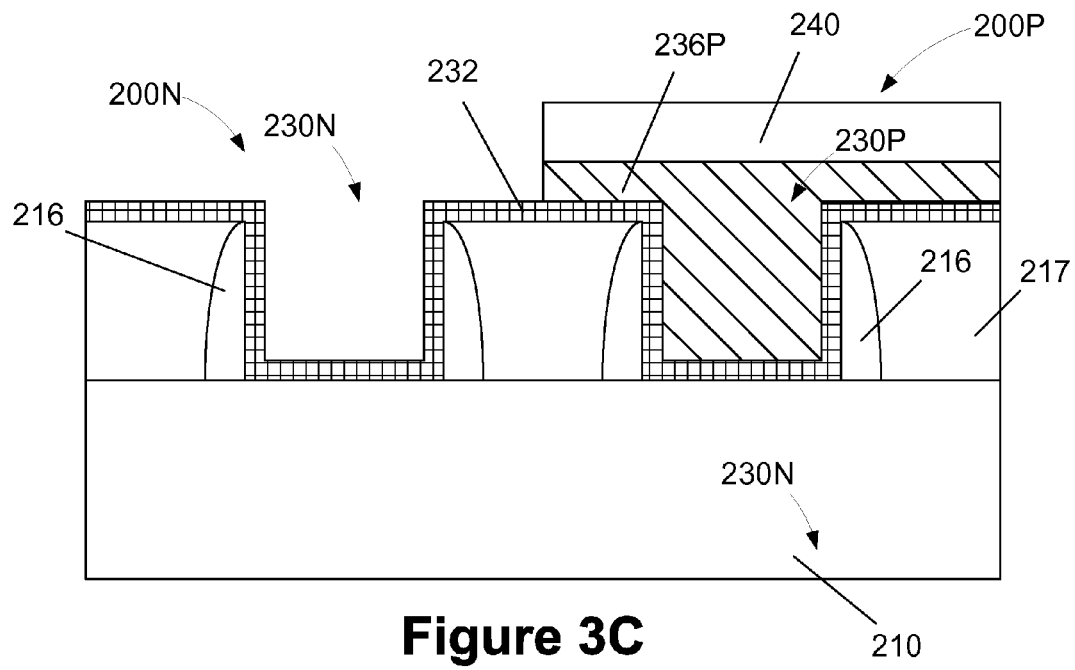

FIG. 3C depicts the devices 200N, 200P after several process operations have been performed. First, a patterned mask layer 240 has been formed above the intermetallic compound material 236P. The patterned mask layer 240 covers the PMOS device 200P and exposes the NMOS device 200N for further processing. Then, an etching process is performed through the patterned mask layer 240 to remove the exposed portions of the intermetallic compound material 236P from the NMOS device 200N. The patterned mask layer 240 may be a patterned hard mask layer or a patterned layer of photoresist material.

Figure 3D:
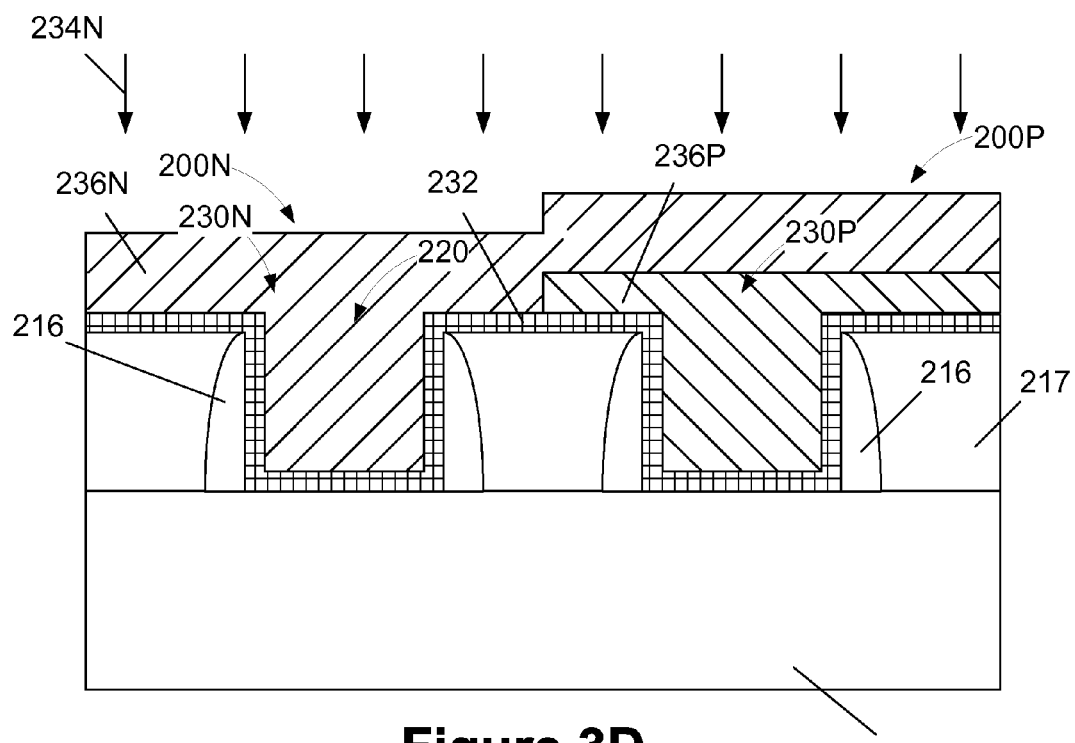

Next, as shown in FIG. 3D, the deposition process 234N is performed to deposit a tailored intermetallic compound material 236N above the device 200N and in the gate cavity 220 for the NMOS device 200N. Importantly, the intermetallic compound material 236N is formed directly as a result of the deposition process 234N. As depicted, the intermetallic compound material 236N overfills the unfilled portion of the gate cavity 220 of the NMOS device 200N. In one particular example, where the intermetallic compound material 236N is a metal silicide material, it may be an erbium silicide (ErSi) material.

Figure 3E:
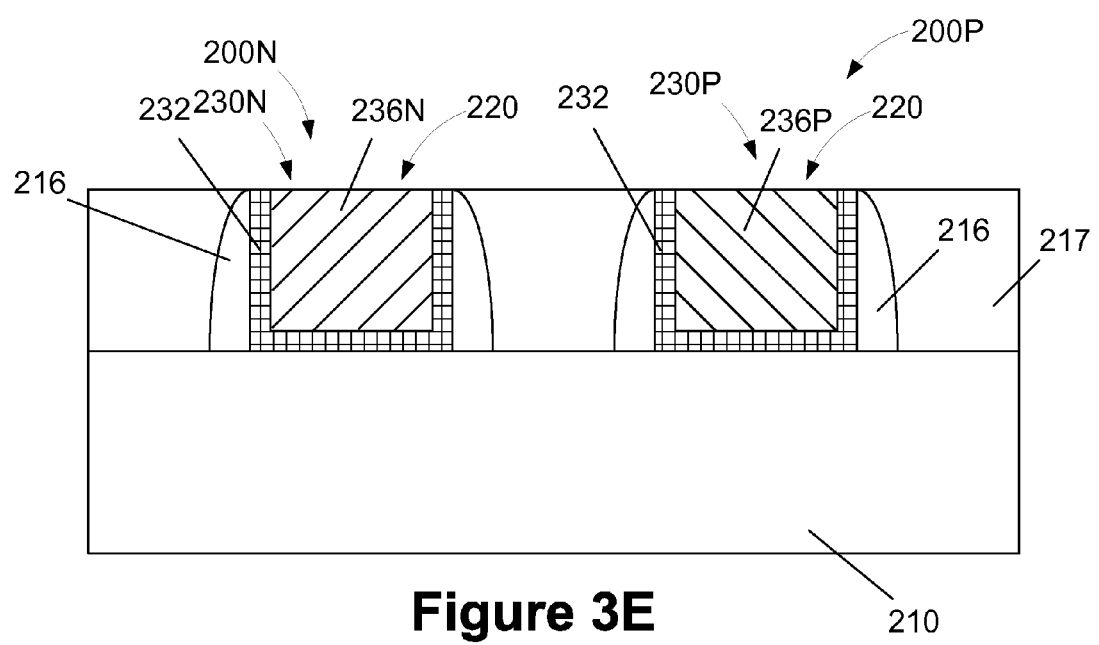

Next, as shown in FIG. 3E, one or more CMP processes are performed to remove excess portions of the insulating layer 232 and the intermetallic compound materials 236P, 236N that are positioned outside of the gate cavities 220 above the layer of insulating material 217. This results in the formation of one illustrative embodiment of the novel replacement gate structure 230N for the NMOS device 200N and a novel replacement gate structure 230P for the PMOS device 200P. Of course, as will be recognized by those skilled in the art after a complete reading of the present application, the method of forming replacement gate structures 230N, 230P disclosed herein are equally applicable to a variety of semiconductor devices, like the disclosed planar field effect transistors 200N, 200P depicted in FIGS. 3A-3E, as well as non-planar devices, such as FinFET devices, such as the illustrative FinFET device 200F depicted in FIG. 2F. Thus, the particular type of device wherein the replacement gate structures 230N, 230P are employed should not be considered to be a limitation of the presently disclosed inventions.

At the point of fabrication depicted in FIG. 3E, traditional manufacturing operations may be performed to complete the formation of the devices 200N, 200P. For example, contact openings (not shown) may be formed through the layer of insulating material 217 to expose underlying source/drain regions (not shown). Thereafter metal silicide regions (not shown) may be formed on the exposed portions of the source/drain regions and conductive contacts (not shown) may be formed in the contact openings to provide electrical connection to the source/drain regions. Various metallization layers may then be formed above the devices 200N, 200P using known processing techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming replacement gate structures for first and second transistors, comprising:

forming first and second sacrificial gate structures above a semiconducting substrate, each of said first and second sacrificial gate structures comprising at least a sacrificial gate electrode;

performing at least one first etching process to remove at least said sacrificial gate electrode structure from each of said first and second sacrificial gate structures so as to define a first gate cavity and a second gate cavity, said first and second gate cavities being defined by first and second spaced-apart sidewall spacers, respectively, positioned in a layer of insulating material formed above said substrate;

forming a gate insulation layer in said first and second gate cavities;

performing a first deposition process to deposit a first intermetallic compound material in said first and second gate cavities on and in contact with said gate insulation layer so as to over-fill said first and second gate cavities with said first intermetallic compound material;

performing at least one second etching process to remove portions of said first intermetallic compound material that are positioned in said second gate cavity;

performing a second deposition process to deposit a second intermetallic compound material in said second gate cavity on and in contact with said layer of insulating material so as to over-fill said second gate cavity with said second intermetallic compound material and form said second intermetallic compound above said first intermetallic compound material, wherein said first intermetallic compound material and said second intermetallic compound material are different materials; and performing at least one planarization process operation to remove portions of said first and second intermetallic compound materials positioned outside of said first and second gate cavities so as to define:

a first intermetallic compound material structure positioned in said first gate cavity that is contacted on three sides by said gate insulation layer, wherein said first intermetallic compound material structure has a substantially planar first upper surface; and a second intermetallic compound material structure positioned in said second gate cavity that is contacted on three sides by said gate insulation layer, wherein said second intermetallic compound material structure has a substantially planar second upper surface, wherein each of said first and second substantially planar upper surfaces is substantially planar with an upper surface of said layer of insulating material.

2. The method of claim 1, wherein forming said gate insulation layer in first and second gate cavities comprises forming a layer of high-k insulating material in first and second gate cavities.

3. The method of claim 1, wherein said first transistor is a PMOS transistor and said second transistor is an NMOS transistor.

4. The method of claim 1, wherein said first transistor is an NMOS transistor and said second transistor is a PMOS transistor.

5. The method of claim 1, wherein said first intermetallic compound material is comprised of a metal silicide material or a metal carbide material.

6. The method of claim 1, wherein said second intermetallic compound material is comprised of a metal silicide material or a metal carbide material.

7. The method of claim 1, wherein said first deposited intermetallic compound material is comprised of a deposited metal silicide material, said deposited metal silicide material comprising one of tungsten silicide ($WSi_x$), nickel silicide ($NiSi_x$), platinum silicide (PtSi), erbium silicide (ErSi), hafnium silicide (HfSi), ytterbium silicide (YbSi), cobalt silicide (CoSi), molybdenum silicide ($MoSi_x$), titanium silicide (TiSi), and tantalum silicide (TaSi).

8. The method of claim 1, wherein said second deposited intermetallic compound material is comprised of a deposited metal silicide material, said deposited metal silicide material comprising one of tungsten silicide ($WSi_x$), nickel silicide ($NiSi_x$), platinum silicide (PtSi), erbium silicide (ErSi), hafnium silicide (HfSi), ytterbium silicide (YbSi), cobalt silicide (CoSi), molybdenum silicide ($MoSi_x$), titanium silicide (TiSi), and tantalum silicide (TaSi).

9. The method of claim 1, wherein performing said at least one planarization comprises performing at least one chemical mechanical polishing process operation.

10. The method of claim 1, wherein said first deposited intermetallic compound material is comprised of a deposited metal carbide material, said deposited metal carbide material comprising one of hafnium carbide (HfC), titanium carbide (TiC) and tantalum carbide (TaC).

11. The method of claim 1, wherein said second deposited intermetallic compound material is comprised of a deposited metal carbide material, said deposited metal carbide material comprising one of hafnium carbide (HfC), titanium carbide (TiC) and tantalum carbide (TaC).

12. The method of claim 1, wherein sidewall surfaces of each of said first and second gate cavities have a substantially continuously straight profile from a bottom of said respective first and second gate cavities to a top of said respective first and second gate cavities.

13. A method of forming replacement gate structures for first and second transistors, comprising:

forming first and second sacrificial gate structures above a semiconducting substrate, each of said first and second sacrificial gate structures comprising at least a sacrificial gate electrode;

forming at least one sidewall spacer proximate opposite sides of each of said first and second sacrificial gate structures;

forming a layer of insulating material above said substrate;

performing at least one first etching process to remove at least said sacrificial gate electrode structure from each of said first and second sacrificial gate structures so as to thereby define a first gate cavity and a second gate cavity;

forming a gate insulation layer comprised of a high-k insulating material in said first and second gate cavities;

performing a first deposition process to deposit a first metal silicide material in said first and second gate cavities on and in contact with said gate insulation layer so as to over-fill said first and second gate cavities with said first metal silicide material;

forming a patterned mask layer above said first metal silicide material, said patterned mask layer covering a first region where said first transistor will be formed and exposing a second region where said second transistor will be formed;

performing at least one second etching process to remove portions of said first metal silicide material that are exposed by said patterned mask layer and thereby remove said first metal silicide material from said second gate cavity;

after performing said at least one second etching process, removing said patterned mask layer;

performing a second deposition process to deposit a second metal silicide material in said second gate cavity on and in contact with said layer of insulating material so as to over-fill said second gate cavity with said second metal silicide material and form said second metal silicide material above said first metal silicide material; and performing at least one chemical mechanical polishing process to remove portions of said first and second metal silicide materials positioned outside of said gate first and second gate cavities so as to define:

a first metal silicide material structure positioned in said first gate cavity that is contacted on three sides by said gate insulation layer, wherein said first metal silicide material structure has a substantially planar first upper surface; and a second metal silicide material structure positioned in said second gate cavity that is contacted on three sides by said gate insulation layer, wherein said second metal silicide material structure has a substantially planar second upper surface, wherein each of said first and second substantially planar upper surfaces is substantially planar with an upper surface of said layer of insulating material.

14. The method of claim 13, wherein said first transistor is a PMOS transistor and said second transistor is an NMOS transistor.

15. The method of claim 13, wherein said first transistor is an NMOS transistor and said second transistor is a PMOS transistor.

16. The method of claim 13, wherein said first gate cavity is defined by said at least one sidewall spacer positioned proximate opposite sides of said first sacrificial gate structure and said second gate cavity is defined by said at least one sidewall spacer positioned proximate opposite sides of said second sacrificial gate structure.

17. The method of claim 13, wherein sidewall surfaces of each of said first and second gate cavities have a substantially continuously straight profile from a bottom of said respective first and second gate cavities to a top of said respective first and second gate cavities.

18. The method of claim 13, wherein said first metal silicide material comprises nickel silicide ($NiSi_x$) and said second metal silicide comprises erbium silicide (ErSi).

* * * * *